United States Patent
Tang et al.

(10) Patent No.: US 9,159,810 B2
(45) Date of Patent: Oct. 13, 2015

(54) DOPING A NON-PLANAR SEMICONDUCTOR DEVICE

(75) Inventors: Daniel Tang, Fremont, CA (US); Tzu-Shih Yen, Hsinchu (TW)

(73) Assignee: ADVANCED ION BEAM TECHNOLOGY, INC., Hsin-Chu (TW)

( * ) Notice: Subject to any disclaimer, the term of this patent is extended or adjusted under 35 U.S.C. 154(b) by 177 days.

(21) Appl. No.: 13/592,191

(22) Filed: Aug. 22, 2012

(65) Prior Publication Data
US 2014/0054679 A1    Feb. 27, 2014

(51) Int. Cl.
| | |
|---|---|
| *H01L 21/336* | (2006.01) |
| *H01L 29/66* | (2006.01) |
| *H01L 21/265* | (2006.01) |
| *H01L 29/78* | (2006.01) |
| *H01L 21/8234* | (2006.01) |

(52) U.S. Cl.
CPC .... *H01L 29/66803* (2013.01); *H01L 21/26586* (2013.01); *H01L 29/785* (2013.01); *H01L 21/823431* (2013.01)

(58) Field of Classification Search
CPC .............................................. H01L 21/823431
USPC .................... 438/284, 525, 529; 257/E21.442
See application file for complete search history.

(56) References Cited

U.S. PATENT DOCUMENTS

| | | | |
|---|---|---|---|
| 6,229,148 B1 * | 5/2001 | Prall et al. ............. | 257/E21.336 |
| 6,867,460 B1 * | 3/2005 | Anderson et al. ............. | 257/351 |
| 7,394,078 B2 * | 7/2008 | Gupta et al. .......... | 257/E21.345 |
| 2008/0050897 A1 * | 2/2008 | Kottantharayil .............. | 438/525 |

* cited by examiner

*Primary Examiner* — Chandra Chaudhari
(74) *Attorney, Agent, or Firm* — Morrison & Foerster LLP

(57) ABSTRACT

In doping a non-planar semiconductor device, a substrate having a non-planar semiconductor body formed thereon is obtained. A first ion implant is performed in a region of the non-planar semiconductor body. The first ion implant has a first implant energy and a first implant angle. A second ion implant is performed in the same region of the non-planar semiconductor body. The second ion implant has a second implant energy and a second implant angle. The first implant energy may be different from the second implant energy. Additionally, the first implant angle may be different from the second implant angle.

26 Claims, 9 Drawing Sheets

DOPING A NON-PLANAR SEMICONDUCTOR DEVICE

BACKGROUND

1. Field

This relates generally to the manufacturing of semiconductor devices and, more specifically, to doping a non-planar semiconductor device.

2. Related Art

As semiconductor manufacturers continue to shrink the dimensions of transistor devices in order to achieve greater circuit density and higher performance, short-channel effects, such as parasitic capacitance and off-state leakage, increasingly impair transistor device characteristics. Fin field effect transistors (FinFETs), such as double-gate transistors, tri-gate transistors, and gate-all-around transistors, are a recent development in semiconductor processing for controlling such short-channel effects. A FinFET has a fin that protrudes above a substrate surface. The fin forms the body of the FinFET device and has fewer paths for current leakage than a planar body. Additionally, the fin creates a longer effective channel width, thereby increasing the on-state current and reducing short channel effects.

The fin defines the channel, the source/drain regions, and the source/drain extension regions of the FinFET. Like conventional planar metal-oxide semiconductor field effect transistors (MOSFETs), the channel, source, drain, source extension, and drain extension regions of a FinFET device are doped with impurities (i.e., dopants) to produce desired electrical characteristics. Ideally, these regions are each uniformly doped along the height of the fin. Poor dopant uniformity may cause undesirable threshold voltage variations across the height of the gate as well as source/drain punch-through issues.

One conventional method for doping the channel, source/drain, and source/drain extension regions of a FinFET is ion implantation. In order to provide uniform doping on both the top and sides of the fin, ion implantation is conventionally performed at a single energy and at an oblique angle to the vertical. However, as device structures become increasingly dense, adjacent structures, such as mask layers and neighboring fins, can cause implant shadowing and result in the non-uniform doping of the FinFET. One method for avoiding implant shadowing is to perform implants at a lower implant angle where dopants are implanted more vertically. However, a lower implant angle results in poor dopant distribution across the height of the fin as well as poor dopant retention along the sidewalls of the fin, thereby causing poor dopant uniformity in fin.

SUMMARY

In one exemplary embodiment, a substrate having a non-planar semiconductor body formed thereon is obtained. A first ion implant is performed in a region of the non-planar semiconductor body. The first ion implant has a first implant energy and a first implant angle. A second ion implant is performed in the same region of the non-planar semiconductor body. The second ion implant has a second implant energy and a second implant angle. The first implant energy may be different from the second implant energy. Additionally, the first implant angle may be different from the second implant angle.

DETAILED DESCRIPTION

The following description is presented to enable a person of ordinary skill in the art to make and use the various embodiments. Descriptions of specific devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims. For example, exemplary processes for doping a FinFET device are disclosed below. It should be appreciated that these exemplary processes may also be applied to non-planar semiconductor devices other than FinFET devices, such as, non-planar multi-gate transistor devices and non-planar nano-wire transistor devices.

Figure 1:
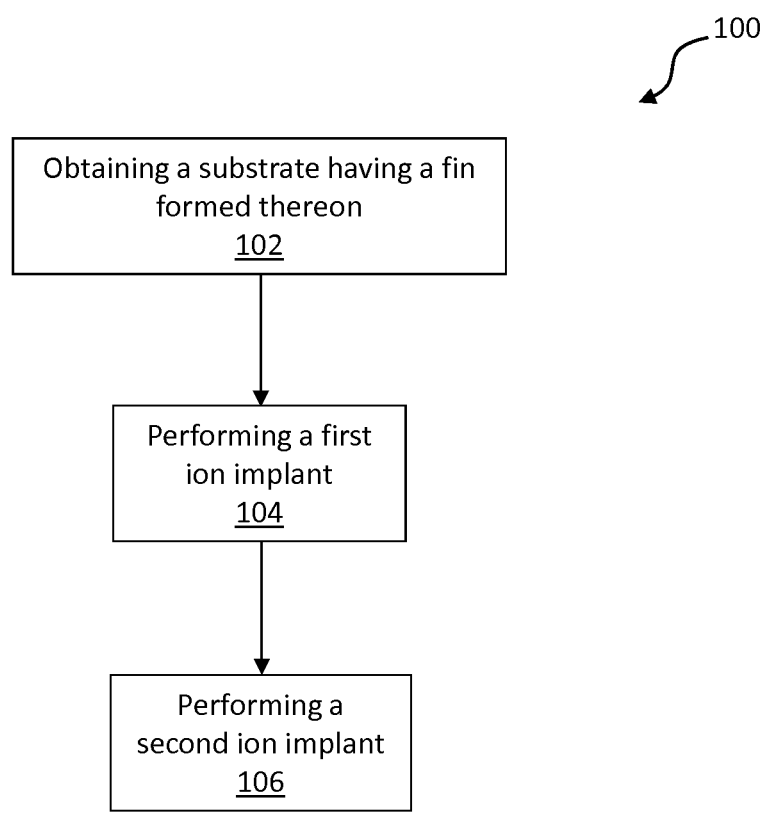
FIG. 1 illustrates an exemplary process for doping a FinFET device.

FIG. 1 depicts an exemplary process 100 for doping a FinFET device. At block 102 of process 100, a substrate having a fin formed thereon may be obtained. The fin may include a channel region, a source region, a drain region, a source extension region, and a drain extension region. At block 104, a first ion implant may be performed in a region of the fin. The region may include any one of the channel region, source region, drain region, source extension region, and drain extension region. Dopants may be implanted at a first implant energy and at a first implant angle relative to an axis orthogonal to the surface of the substrate. At block 106, a second ion implant may be performed in the same region as in the first ion implant. Dopants may be implanted at a second implant energy and at a second implant angle relative to an axis orthogonal to the surface of the substrate. In one example, the second implant energy is different from the first implant energy and the second implant angle is different from the first implant angle. In one such example, the first implant energy may be greater than the second implant energy and the first implant angle may be smaller than the second implant angle.

Figure 2A:
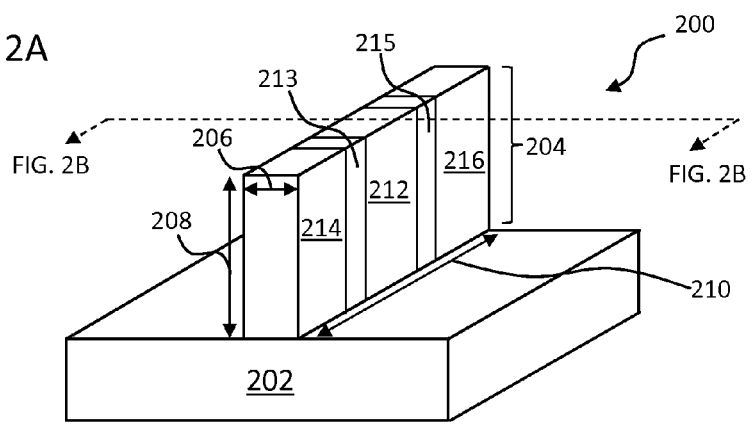
FIGS. 2A-2C illustrate cross-sectional views of an exemplary FinFET at various stages of an exemplary process for doping a FinFET device.
Figure 2B:
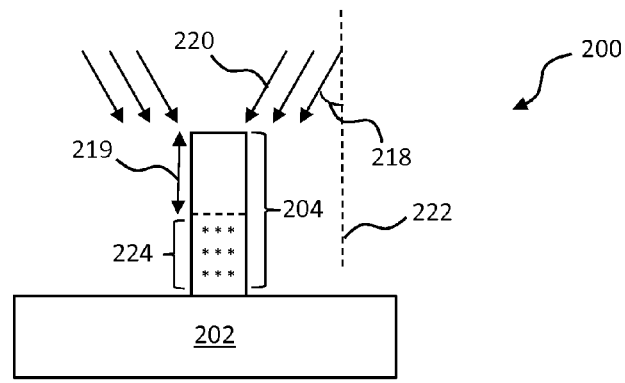
Figure 2C:
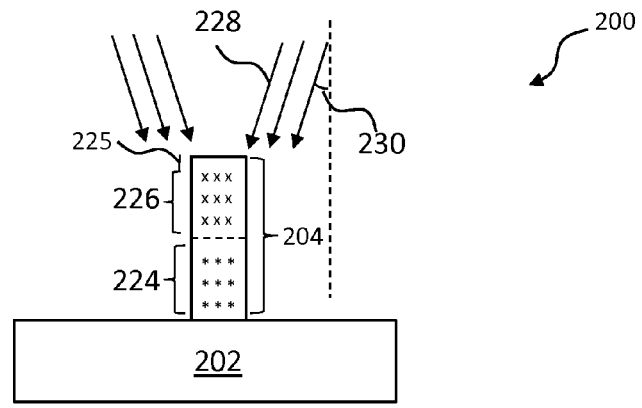

A more detailed description of exemplary process 100 is now provided with simultaneous reference to FIG. 1 and FIGS. 2A-2C. FIGS. 2A-2C illustrate cross-sectional views of a FinFET device 200 at various stages of exemplary process 100. At block 102 of exemplary process 100 and shown in FIG. 2A, a substrate 202 having a fin 204 formed thereon may be obtained. Substrate 202 may include any commonly known substrate suitable for forming a FinFET device 200. For example, substrate 202 may include a single crystalline semiconductor wafer (e.g., silicon, germanium, gallium arsenide, etc.). In another example, substrate may include one or more epitaxial single crystalline semiconductor layers (e.g., silicon, germanium, silicon germanium, gallium arsenide, indium phosphide, indium gallium arsenide, etc.) grown atop a distinct crystalline wafer (silicon, germanium, gallium arsenide etc.). The one or more epitaxially grown semiconductor layers may serve as buffer layers to grade the lattice constant from the distinct crystalline wafer to the top surface of substrate 202. In yet another example, substrate 202 may include an insulating layer (e.g., silicon dioxide, silicon oxynitride, a high-k dielectric layer, etc.) in between a single crystalline semiconductor substrate and an epitaxial layer to form, for example, a silicon-on-insulator substrate. It should be recognized that substrate 202 may include other structures and layers, such as shallow trench isolation structures.

Fin 204 on substrate 202 may be formed by conventional semiconductor fabrication methods, such as, but not limited to, photolithography, etch, and chemical vapor deposition. Fin 204 may have a channel region 212 disposed between a source region 214 and a drain region 216. A source extension region 213 may be disposed between channel region 212 and source region 214 and a drain extension region 215 may be disposed between channel region 212 and drain region 216. Fin 204 may comprise a single crystalline semiconductor material (e.g., silicon, germanium, gallium arsenide etc.). Alternatively, fin 204 may comprise multiple layers of epitaxially grown semiconductor materials. For example, the multiple layers of epitaxially grown semiconductor materials may form a vertical array of multiple nanowires in the channel region. As shown in FIG. 2A, fin 204 has a critical dimension 206, a height 208, and a length 210. In one example, critical dimension 206 may be 5-50 nm, height 208 may be 15-150 nm, and length may be 20-1200 nm.

At block 104 of exemplary process 100 and as shown in FIG. 2B, a first ion implant is performed. The ion implant may be performed by any suitable ion beam implanting system known in the art. An exemplary ion beam implanting system is described later in greater detail. Arrows 220 represent the implanting of dopant ions into fin 204 during the first ion implant. Dopant ions may be implanted into one or more regions of fin 204 such as the source/drain regions 214, 216, the source/drain extension regions 213, 215, or the channel region 212. The channel region 212 is typically implanted with p-type dopant ions when forming a NMOS transistor device and with n-type dopant ions when forming a PMOS transistor device. Conversely, the source/drain regions 214, 216, and the source/drain extension regions 213, 215 are typically implanted with p-type dopant ions when forming a PMOS transistor device and with n-type dopant ions when forming a NMOS transistor device. Examples of p-type dopant ions include boron containing ions such as, but not limited to B+, B2+, BF+, BF2+, and BF3+. Examples of n-type dopants include phosphorous and arsenic containing ions such as, but not limited to As+, As2+, P+, and P2+.

The first ion implant may be performed at a first implant energy. The implant energy at least partially determines the depth 219 at which dopant ions are implanted into fin 204. The higher the implant energy, the greater the depth 219 at which dopant ions may be implanted into fin 204. The first implant energy may be defined to implant dopant ions to any desired depth in fin 204. As shown in FIG. 2B, the first implant energy may be defined to implant dopant ions to a depth 219 in a bottom portion 224 of fin 204. For example, the first implant energy may be defined to implant boron ions mainly to a depth of 5-110 nm in fin 204. In one example, the first implant energy may be 0.5-15 KeV. In another example, the first implant energy may be 2-10 KeV. In yet another example, the first implant energy may be 2-6 KeV.

The first ion implant may have a first implant angle 218. First implant angle 218 may define the direction at which dopant ions are implanted into fin 204. First implant angle 218 may be defined relative to an axis 222 that is orthogonal to the surface of substrate 202. First implant angle 218 may be substantially vertical (e.g., 0-10 degrees) to avoid implant shadowing. In this way, the doping of fin 204 may be independent of the dimensions and spacing of neighboring structures. In one example, first implant angle 218 may be 0-5 degrees. In another example, first implant angle 218 may be 0-3 degrees. In yet another example, first implant angle 218 may be 0-1 degrees. It should be recognized that FinFET device 200 may be rotated during the first ion implant to achieve an even distribution of dopants on all sides of fin 204.

At block 106 of exemplary process 100 and as shown in FIG. 2C, a second ion implant may be performed. Second ion implant may be performed by the same ion beam implanting system that performs the first ion implant. Alternatively, a different ion beam implanting system may perform the second ion implant. Arrows 228 represent the implanting of dopant ions into fin 204 during the second ion implant. Dopant ions are implanted into the same one or more regions (i.e., source/drain regions, source/drain extension regions, or channel region) of fin 204 in which the first ion implant is performed. The second ion implant also implants the same dopant ion type (i.e., p-type or n-type) as the first ion implant in the same one or more regions.

The second ion implant may be performed at a second implant energy. The second implant energy may be different from the first implant energy where dopant ions are implanted to a different depth in fin 204. For example, the second implant energy may be lower than the first implant energy. As shown in FIG. 2B, the second implant energy may be defined to implant dopant ions to a depth 225 in portion 226 that is above portion 224. Portion 226 may be on or partially overlapping with portion 224. In an alternative example, second implant energy may be higher than the first implant energy. In one example, the second implant energy may be defined to implant boron ions mainly to a depth of 5-75 nm in fin 204. In one example, the second implant energy may be 0.5-10 KeV. In another example, the second implant energy may be 0.5-6 KeV. In yet another example, the second implant energy may be 0.5-2 KeV.

The second ion implant may have a second implant angle 230. Second implant angle 230 may be defined relative to an axis orthogonal to the surface of substrate 202. Second implant angle 230 may be approximately equal to first implant angle 218. Alternatively, second implant angle 230 may be different from first implant angle 218. Second implant angle 230 may be substantially vertical (e.g., 0-10 degrees) to avoid implant shadowing. In one example, second implant angle 230 may be 1-8 degrees. In another example, second implant angle 230 may be 3-5 degrees. It should be recognized that FinFET device 200 may be rotated during the second ion implant to achieve an even distribution of dopants on all sides of fin 204.

Figure 3A:
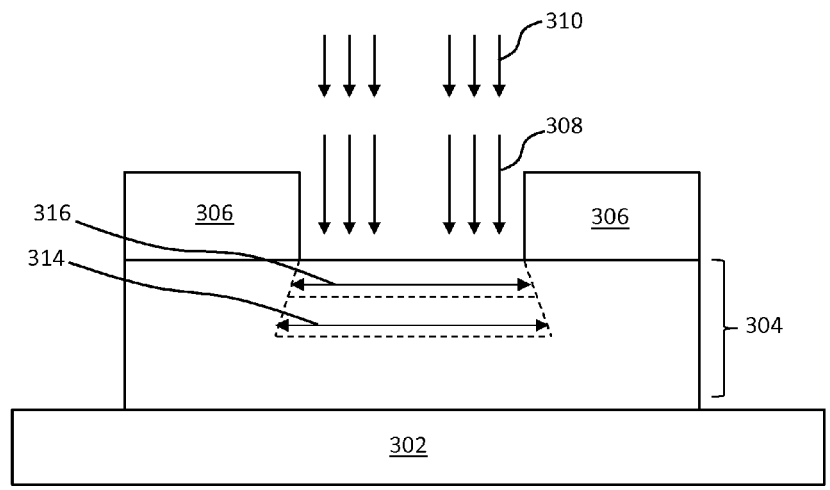
FIGS. 3A and 3B illustrate cross-sectional views of an exemplary FinFET at various stages of an exemplary process for doping a FinFET device.

The implant energy may affect the straggle of dopants implanted into fin 204. The straggle is the spread of the dopant ions implanted in fin 204. Straggle occurs both in the horizontal direction (e.g., along the length 210 of fin 204) and in the vertical direction (e.g., along the height 208 of fin 204) and increases with implant energy. The different implant energies of the first ion implant and the second ion implant may cause greater combined straggle and may result in poor dopant uniformity across the length 210 and height 208 of fin 204. For example, FIG. 3A shows a cross-section view of a fin 304 along the length of the fin. Fin 304 may be provided a first ion implant 308 and a second ion implant 310 where the first ion implant 308 has a higher energy than the second implant 310. Patterned mask layer 306 defines the region in fin 304 to be implanted. Because of the different implant energies, first ion implant 308 may produce a horizontal straggle 314 that is greater than the horizontal straggle 316 produced by the second ion implant 310. This may result in poor dopant uniformity.

Figure 3B:
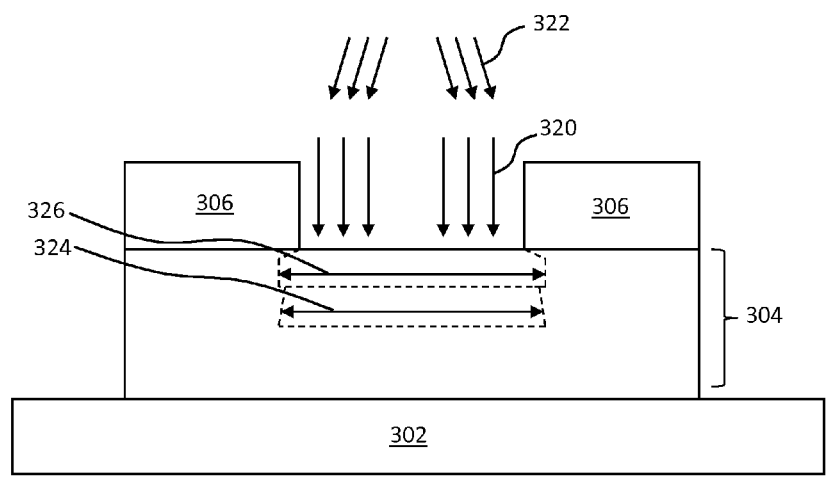

The implant angles of the first ion implant and the second ion implant may be defined to reduce the overall horizontal straggle resulting from different implant energies. For example, the first implant energy may be higher than the second implant energy while the first implant angle may be smaller than the second implant angle. In one such example, the first ion implant may have a first implant energy of 2-10 KeV and a first implant angle of 0-2 degrees while the second ion implant may have a second implant energy of 0.5-2 KeV and a second implant angle of 2-10 degrees. FIG. 3B shows a cross-sectional view of a fin 304 along the length of the fin and illustrates one such example. The first ion implant 320 may have a higher implant energy and a lower implant angle than the second ion implant 322. The different implant energies and implant angles may be defined such that the first ion implant 320 produces a straggle 324 that approximately matches the straggle 326 produced by the second ion implant 322, thereby improving the dopant uniformity in fin 304.

Different dopant ion species having different molecular masses may be implanted in the first and second ion implants to reduce the overall straggle caused by the different implant energies. A dopant ion species having a larger molecular mass tends to have a smaller penetration depth and also less straggle. To reduce overall straggle, a dopant ion species having a larger molecular mass may be implanted at a higher implant energy while a dopant ion species having a lower molecular mass may be implanted at a lower implant energy. For example, the first implant energy may be higher than the second implant energy and the first ion implant may implant a dopant ion species having a molecular mass larger than that of the second ion implant. In one such example, the first ion implant may implant a dopant ion species of arsenic having a larger molecular mass of 74.9 at the higher implant energy of 2-10 KeV and the second ion implant may implant a dopant ion species of phosphorous having a smaller molecular mass of 31.0 at a lower implant energy of 0.5-2 KeV.

Higher energy ion implants may be preferably performed prior to lower energy ion implants. In this way, shallowly implanted dopants are not displaced ("knocked in") by subsequent deeper dopants implanted by higher energy implants. Moreover, performing higher energy implants prior to lower energy implants improves manufacturability as ion beam tuning in ion beam implanting systems is more favorable from high to low energy rather than vice versa. In one example, the first implant energy may be greater than the second implant energy and the first ion implant may be performed prior to the second ion implant.

As previously discussed, it should be appreciated that exemplary process 100 may be applied to other non-planar semiconductor devices, such as, but not limited to non-planar multi-gate transistor devices, non-planar gate-all-around transistor devices, and non-planar nano-wire transistor devices. For example, fin 204 may be substituted with other non-planar semiconductor bodies such as, nano-wires or vertical arrays of nanowires.

Figure 4:
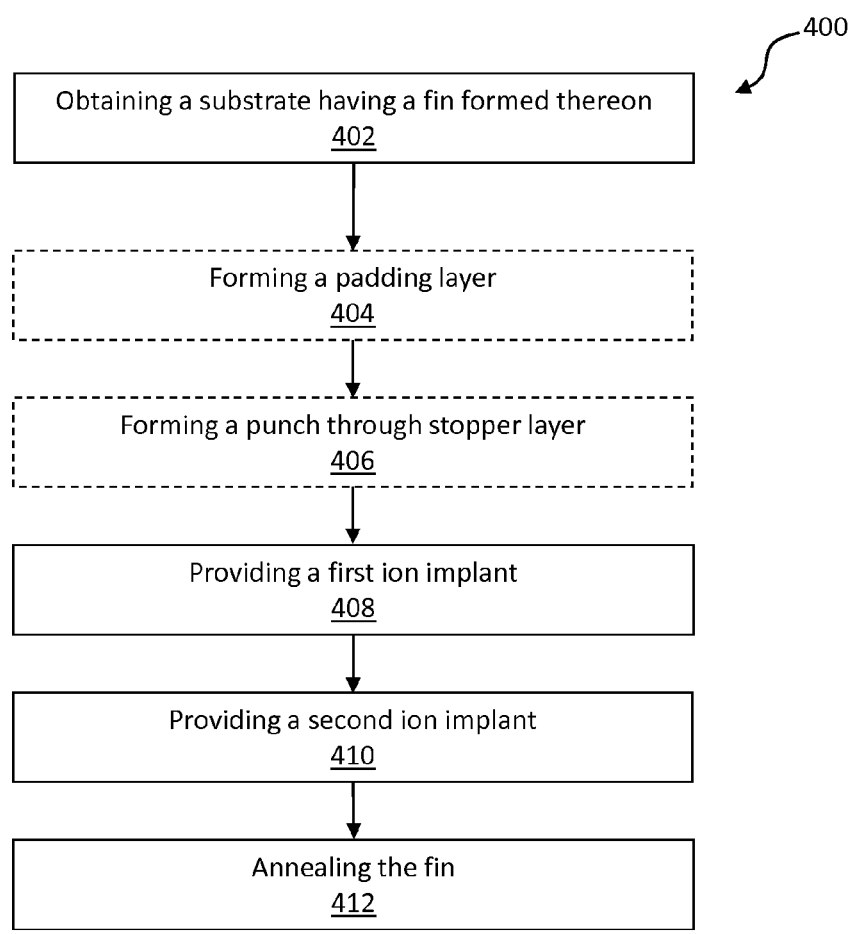
FIG. 4 illustrates another exemplary process for doping a FinFET device.

With reference to FIG. 4, another exemplary process 400 for doping a FinFET device is shown. FIGS. 5A-5F illustrate cross-sectional views of a FinFET device 500 representing the various stages in exemplary process 400. Exemplary process 400 comprises blocks 402 to 412. Optional blocks 404 and 406 are represented with a dotted outline.

Figure 5A:
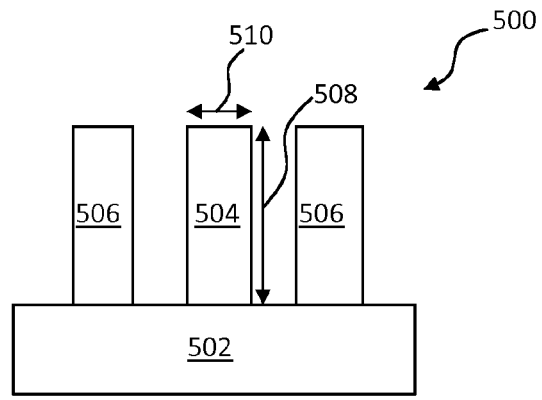
FIGS. 5A-5F illustrate cross-sectional views of an exemplary FinFET at various stages of an exemplary process for doping a FinFET device.

At block 402 of exemplary process 400 and as shown in FIG. 5A, a substrate having a fin 504 formed thereon may be obtained. Substrate 502 may comprise a single crystalline semiconductor substrate, one or more epitaxial grown layers over a distinct silicon wafer, a silicon-on-insulator substrate, or any other well-known substrate on which a FinFET device may be formed. Fin 504 may include source/drain regions, source/drain extension regions, and a channel region. Fin 504 may have a critical dimension 510, a height 508, and a length (not shown). Adjacent structures 506 such as masks, dummy features, or neighboring fins may be formed next to fin 504.

Figure 5B:
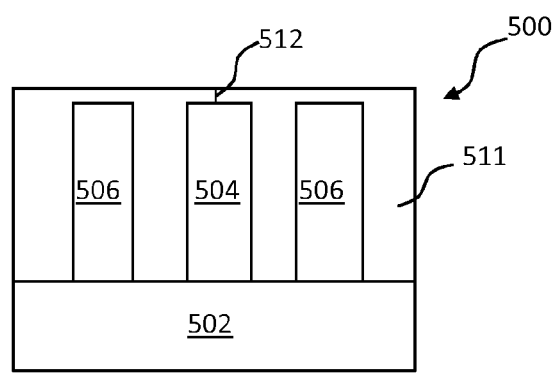

At optional block 404 of exemplary process 400 and as shown in FIG. 5B, a padding layer 511 may be formed over and around fin 504. Padding layer 511 may fully fill the spaces between fin 504 and adjacent structures 506 and may have a top surface that is approximately planar over fin 504 and adjacent structures 506. Padding layer 511 may be formed to block dopants from reaching substrate 502 and to prevent re-sputtering of ions onto the sidewalls of fin 504 during ion implanting. Additionally, padding layer 511 increases dopant retention on the sidewalls of fin 504. Padding layer 511 may comprise any material that traps implanted dopant ions. For example, padding layer 511 may be a dielectric material or an in-situ doped material, such as, but not limited to, undoped silicon oxide, doped silicon oxide, silicon nitride, and silicon oxynitride.

The thickness 512 of padding layer 511 above the top surface of fin 504 may be sufficiently thin so as not to impede dopant ions from entering fin 504 during implanting. For example, padding layer 511 may be formed to a thickness 512 of 0-10 nm above the top surface of fin 504. Padding layer 511 may be formed by conventional semiconductor processes such as chemical vapor deposition, spin-on deposition, sol-gel deposition processes, selective deposition processes, and selective etch back processes. Padding layer 511 may be formed prior to implant blocks 408 and 410 and may be removed prior or subsequent to block 412 of annealing fin 504.

Figure 5C:
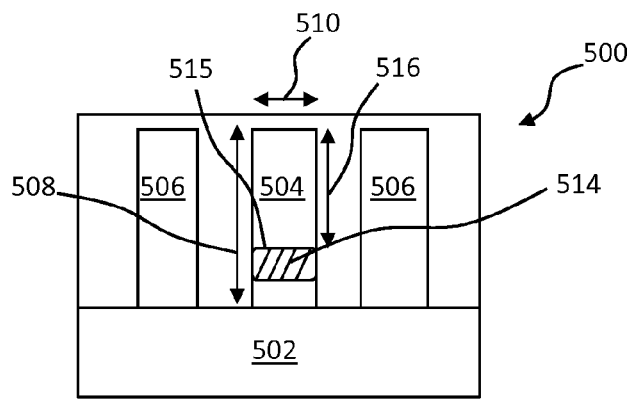

Referring to optional block 406 of exemplary process 400 and as shown in FIG. 5C, a punch through stopper (PTS) layer 514 may be formed in fin 504. PTS layer 514 may be formed under the source/drain regions, the channel region and/or the source/drain extension regions of fin 504 to prevent electrical punch-through. The source/drain regions, the channel region and/or the source/drain extension regions may partially overlap with PTS layer 514. Additionally, PTS layer 514 may act as a barrier by blocking or significantly retarding dopant migration during implanting and annealing processes and thus may minimize the vertical straggle of dopants in fin 504. PTS layer 514 may create an abrupt interface 515 between the PTS layer 514 and the source/drain regions, the channel region and/or the source/drain extension regions of fin 504 in which the dopant concentration in each region abruptly extinguishes. For example, PTS layer 514 may be formed such that the sheet resistance (Rs) in the source/drain regions, the channel region and/or the source/drain extension regions increases by 3 orders of magnitude over a 3 nm thickness at the interface 515 between the PTS layer 514 and the source/drain regions, the channel region and/or the source/drain extension regions.

PTS layer 514 may be formed by implanting into fin 504 any species that resist the movement of dopants such as, but not limited to carbon, oxygen, fluorine, nitrogen, or any combinations thereof. Alternatively, PTS layer 514 may be formed by implanting a dopant type that is opposite from the dopant type that is implanted above PTS layer 514. For example, the PTS layer 514 may be formed with an n-type dopant if a p-type dopant is implanted in the region above PTS layer 514.

The depth 516 at which PTS layer 514 is formed may define the effective height 516 of FinFET device 500. The effective height 516 partially determines the effective channel width of FinFET device 500. For example, a greater effective height 516 may create a greater effective channel width. The effective channel width of FinFET device 500 may thus be defined using the implant process by controlling the depth at which the PTS layer 514 is formed. In this way, different FinFET devices having the same physical fin height, but having different effective channel widths, may be fabricated on the same substrate by controlling the depth at which the fins are implanted. This obviates the need to fabricate different fins with different physical heights or to implement various FinFET widths across the substrate, thereby eliminating costly lithography and etch steps.

PTS layer 514 may be formed in the substrate 502 under fin 504. In one such example, PTS layer 514 may partially overlap with the bottom portion of fin 504. In another example, PTS layer 514 may be formed at any depth 516 within fin 504. PTS layer 514 may be preferably formed at a depth 516 greater than the critical dimension 510 of fin 504. For example, PTS layer 514 may be formed in fin 504 at a depth 516 greater than critical dimension 510 and less than height 508. The depth 516 of the PTS layer 514 formed may have a uniformity of 5% or less across the length of fin 504. PTS layer 514 may be formed either prior to or subsequent to steps 408 and 410 of the providing a first and second ion implant.

Figure 5D:
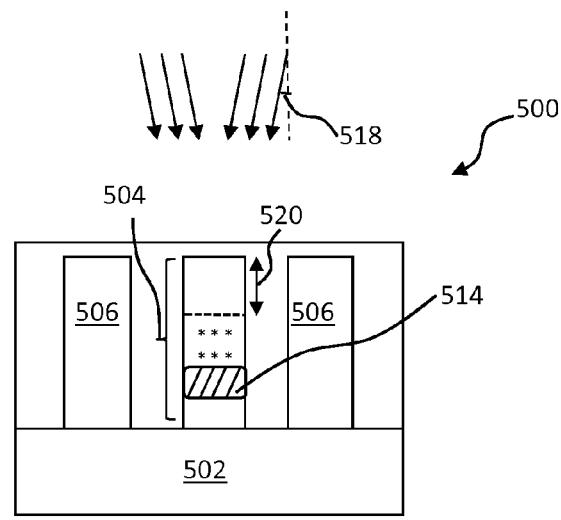

At block 408 of exemplary process 400 and as shown in FIG. 5D, a first ion implant is performed. Dopant ions may be implanted into one or more regions of fin 504, such as, the source/drain regions, the source/drain extension regions, or the channel region. The first ion implant may be performed at a first implant energy. The first implant energy may be defined to implant dopant ions to any desired depth 520 in fin 504. For example, the first implant energy may be defined to implant dopant ions to a depth above PTS layer 514. Implanted dopant ions from the first ion implant may partially overlap with PTS layer 514 in fin 504. In one example, the first implant energy may be 0.5 KeV-15 KeV. In another example, the first implant energy may be 2 eV-10 KeV. In yet another example, the first implant energy may be 2 KeV-6 KeV. The first ion implant may have a first implant angle 518. First implant angle 518 may be substantially vertical (e.g., 0-10 degrees) to avoid implant shadowing. In one example, first implant angle 518 may be 0-5 degrees. In another example, first implant angle 518 may be 0-3 degrees. In yet another example, first implant angle 518 may be 0-1 degrees.

Figure 5E:
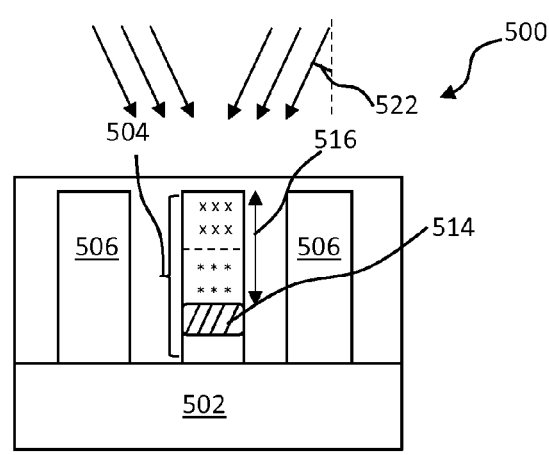

At block 410 of exemplary process 400 and as shown in FIG. 5E, a second ion implant may be performed. Dopant ions of the same dopant type (i.e., p-type or n-type) may be implanted into the same one or more regions (i.e., source/drain regions, source/drain extension regions, or channel region) as in the first ion implant. The second ion implant may be performed at a second implant energy. The second implant energy may be different from the first implant energy where dopant ions may be implanted to a different depth in fin 504. For example, as shown in FIG. 5E, the second implant energy may be lower than the first implant energy where the second ion implant implants dopant ion to a depth less that of the first ion implant. Dopant ions from the second ion implant may partially overlap with dopant ions from the second ion implant in fin 504. In one example, the second implant energy may be 0.5 KeV-10 KeV. In another example, the second implant energy may be 0.5 KeV-6 KeV. In yet another example, the second implant energy may be 0.5 KeV-2 KeV. The second ion implant may have a second implant angle 522. Second implant angle 522 may be approximately equal to first implant angle 518. Alternatively, second implant angle 522 may be different from first implant angle 218. Second implant angle 522 may be sufficiently vertical (e.g., 0-10 degrees) to avoid implant shadowing. In one example, second implant angle 522 may be 1-8 degrees. In another example, second implant angle 522 may be 3-5 degrees.

It should be appreciated that additional ion implants may be performed to implant additional dopant ions into fin 504. For example a third ion implant (not shown) may be performed. Each additional ion implant may have an implant energy and an implant angle. For each additional ion implant, the same dopant ion type (i.e., p-type or n-type) is implanted into the same one or more regions (i.e., source/drain regions, source/drain extension regions, and channel region) as the first and second ion implants. In one example, the total number of ion implants (including the first and second ion implants) may be 2-20. In another example, the total number of ion implants may be 2-6. Each ion implant may have a different implant energy. The ion implants may be performed in a sequence of decreasing implant energy to prevent dopant displacement ("knocking in") during implanting. For example, each ion implant may implant dopant ions into fin 504 to a depth on or above that of the previous ion implant.

The implant angles of the ion implants may be inversely proportional to the implant energies. For example, the ion implant with the highest implant energy may have the smallest implant angle while the ion implant with the lowest implant energy may have the largest implant angle. Table 1 describes an exemplary process where the implant angles are inversely proportional to the implant energies. The exemplary process implants boron ions into the source/drain extension regions of a PMOS FinFET device. The exemplary process comprises a sequence of 6 ion implants where the implant energy decreases while the implant angle increases for each subsequent ion implant.

TABLE 1

| Ion Implant Sequence | Dopant Ion Species | Implant Energy | Implant Angle |
|---|---|---|---|
| 1 | Boron | 8 KeV | 0-1 |
| 2 | Boron | 6 KeV | 1-2 |
| 3 | Boron | 4 KeV | 1-4 |
| 4 | Boron | 2 KeV | 1-6 |
| 5 | Boron | 1 KeV | 1-8 |
| 6 | Boron | 0.5 KeV | 1-10 |

The implant energy and implant angle of each ion implant may be defined to minimize the overall horizontal straggle of dopants in fin 504. For example, the implant energies and implant angles of each ion implant may be defined to achieve a dopant concentration uniformity of 3% or less across the height of the implanted region of fin 504. In an exemplary process where a PTS layer 514 is formed, the implant energies and implant angles of each ion implant may be defined to achieve a dopant concentration uniformity of 3% or less across the depth 516 at which PTS layer 514 is formed.

To reduce overall straggle, one or more of the ion implants may implant a dopant ion species having a different molecular mass from that of the other ion implants. For example, one or more ion implants having higher implant energies may implant a dopant ion species having a higher molecular mass than that of the other ion implants.

Each of the ion implants may be performed serially in a suitable ion implanting system. Alternatively, any two implant steps may be performed simultaneously by an ion implanting system having dual ion beams where one ion beam may perform an ion implant step at one implant energy and the other ion beam may perform another ion implant step at a different implant energy.

Figure 5F:
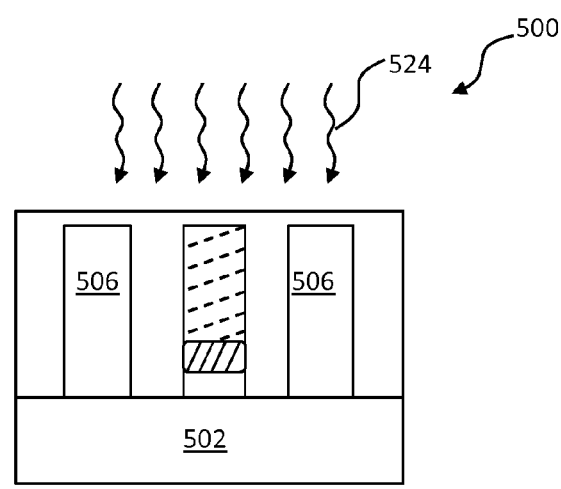

At block 412 of exemplary process 400 and as shown in FIG. 5F, fin 504 may be annealed. Annealing is represented by arrows 524. During annealing, implanted dopants in fin 504 are activated. Additionally, implant damage (e.g, amorphization and crystalline damaged) to fin 504 is repaired by means of crystalline re-growth. During annealing, dopant diffusion is preferably minimized to maintain good dopant uniformity in fin 504. Fin 504 may be annealed by an anneal process that minimizes dopant diffusion. For example, fin 504 may be annealed by a laser annealing process or a pulse laser annealing process. In another example, fin 504 may be annealed such that the dopant diffusion does not exceed 5 nm.

It should be appreciated that blocks 402 through 412 of exemplary process 400 may be performed in any order. For example, block 408 of providing a first ion implant may be performed prior to or after block 410 of providing a second ion implant. Additionally, it should be appreciated that additional semiconductor processing steps not shown in exemplary process 400 may be performed in manufacturing FinFET device 500. For example, a conformal gate dielectric layer may be formed over the channel region of FinFET device 500, a gate electrode may be formed over the conformal gate dielectric layer, and a pair of sidewall spacers may be formed on each side of the gate electrode. The completed FinFET 500 may be a dual-gate FinFET, a tri-gate FinFET, or a gate-all-around FinFET.

Additionally, as previously discussed, it should be appreciated that exemplary process 400 may be applied to other non-planar semiconductor devices, such as, but not limited to non-planar multi-gate transistor devices, non-planar gate-all-around transistor devices, and non-planar nano-wire transistor devices. For example, fin 504 may be substituted with other non-planar semiconductor bodies such as, nano-wires or vertical arrays of nanowires, where the non-planar semiconductor bodies may be doped by exemplary process 400.

Figure 6A:
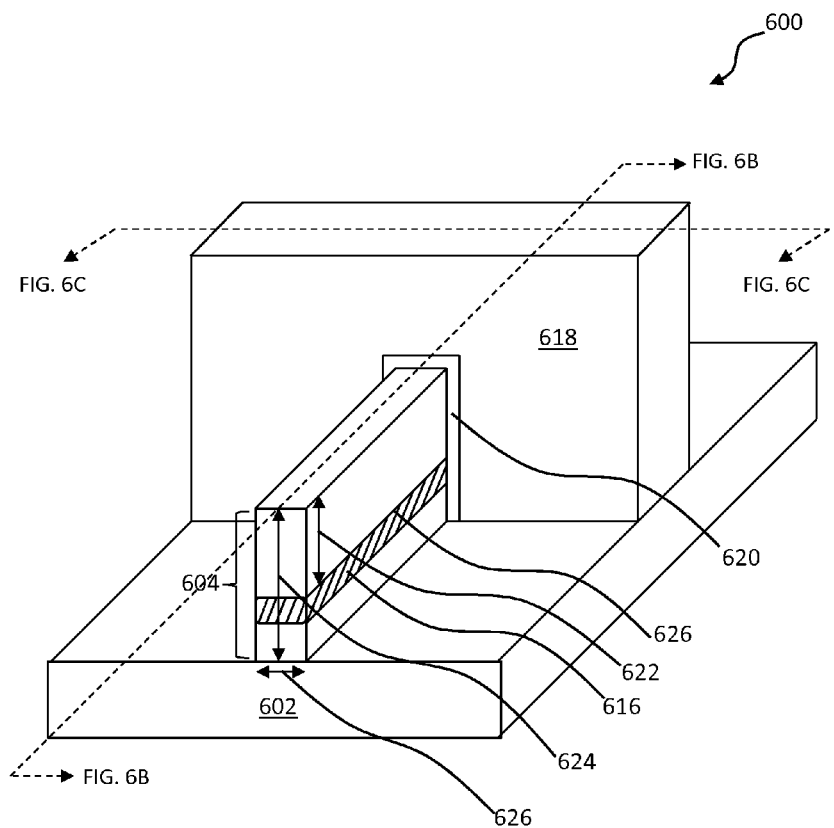
FIGS. 6A-6C illustrate cross-sectional views of an exemplary FinFET device formed by an exemplary process for doping a FinFET device.
Figure 6B:
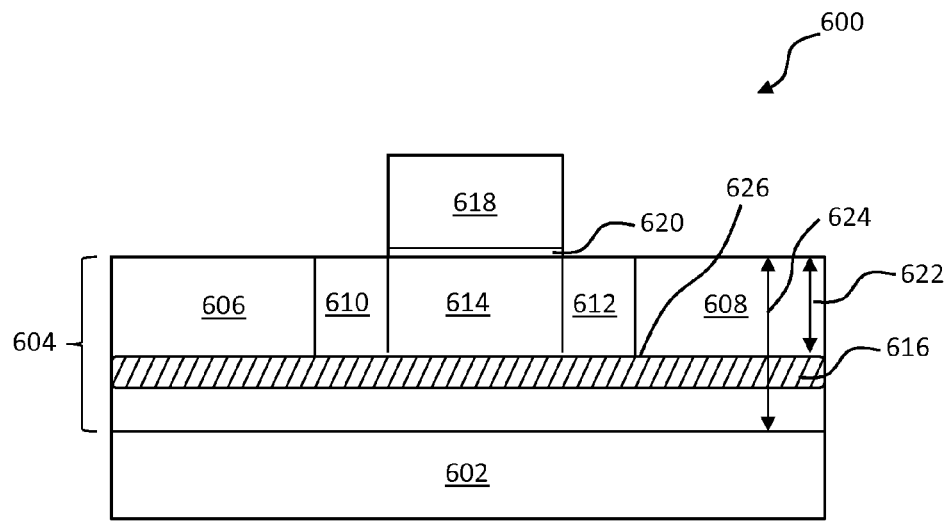
Figure 6C:
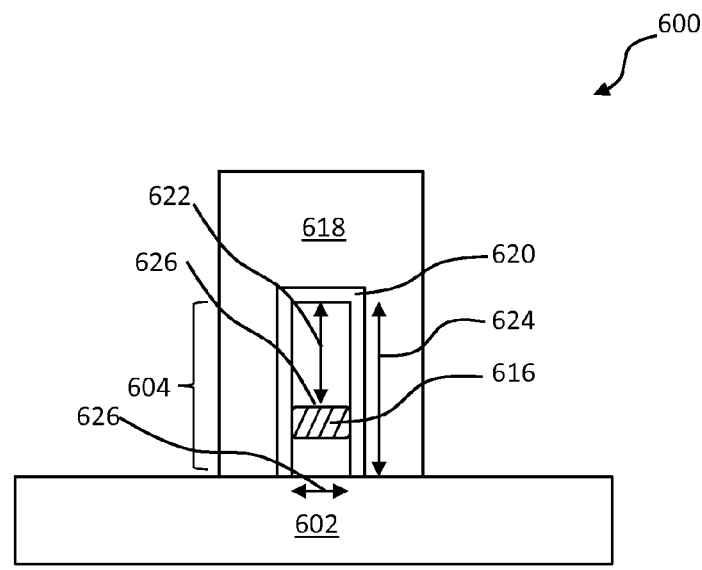

With reference to FIGS. 6A-6C, an exemplary FinFET 600 formed by the exemplary processes described herein is shown. FIG. 6A depicts a three-dimensional cross-sectional view of exemplary FinFET device 600. FIG. 6B depicts a two-dimensional cross-section view of exemplary FinFET device 600 along the length of fin 604. FIG. 6C depicts a two-dimensional cross-section view of exemplary FinFET device 600 along the length of gate electrode 618. In the present embodiment, FinFET device 600 may comprise a fin 604 disposed on a substrate 602. Fin 604 may include a source region 606, a drain region 608, a source extension region 610, a drain extension region 612, and a channel region 614. A PTS layer 616 may be disposed in fin 604 at a depth 622 greater than critical dimension 626 and less than height 624. Depth 626 of PTS layer 616 may have a uniformity of 5% or less across the length of fin 604. As depicted in FIG. 6B, source/drain regions 606 608, source/drain extension regions 610 612, and channel region 614 may be disposed above PTS layer 616. Any one of the regions may partially overlap with PTS layer 616. Each region may be doped to a concentration uniformity of 3% or less across the depth 622. The dopant concentration in any one region may abruptly extinguish at an interface 626 between PTS layer 616 and source/drain regions 606 608, source/drain extension regions 610 612, and channel region 614. In one example, the sheet resistance (Rs) in any one region may increase by 3 orders of magnitude over a 3 nm thickness at interface 626. A gate dielectric layer 620 may be disposed over the channel region 614 of fin 604. Gate dielectric layer 620 may comprise any suitable electrically insulating material such as, but not limited to, silicon oxide, high-k dielectrics, hafnium oxide, and titanium oxide. A gate electrode 618 may be disposed over the gate dielectric layer 620. Gate electrode 618 may comprise any suitable electrically conductive material such as, but not limited to, doped polysilicon, metals, metal nitrides, metal silicides, titanium, tantalum, and tungsten.

The methods of doping a non-planar semiconductor device described herein may be performed using any suitably adapted ion implanting system such as the iPulsar® and the iPulsar Plus®, Advanced USJ Enabler system, available from Advanced Ion Beam Technologies Inc. of Fremont, Calif., USA. It is contemplated that other suitably adapted ion implanting systems, including those available from other manufacturers, may also be utilized to practice the present invention.

Figure 7:
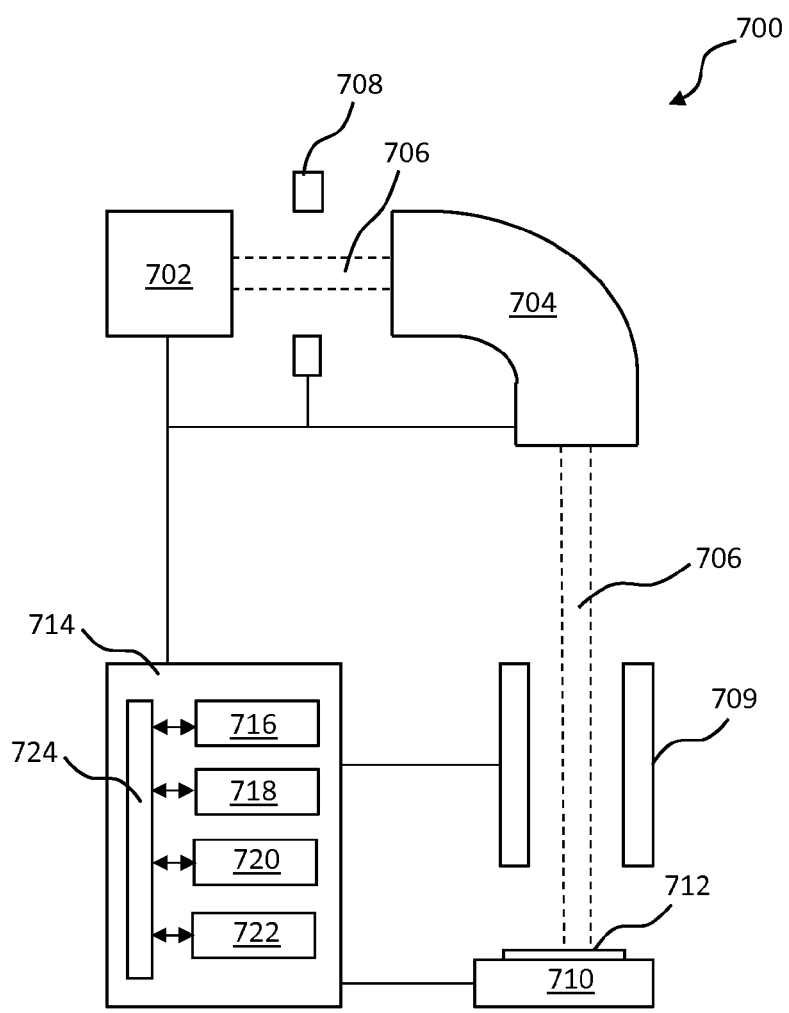
FIG. 7 is a schematic block diagram of an exemplary ion beam implanting system that may be used to dope a FinFET device.

FIG. 7 depicts a schematic, cross-sectional diagram of an exemplary ion implanting system 700 suitable for doping a non-planar semiconductor device, such as a FinFET. The exemplary ion implanting system 700 may comprise an ion source 702, a mass analyzer unit 704, an acceleration stage 708, a deceleration electrode assembly 709, a holding apparatus 710, and a controller 714. During processing, the holding apparatus 710 may support a substrate 712 having a non-planar semiconductor device to be implanted formed thereon. Holding apparatus 710 may rotate substrate 712 to allow dopant ions to be evenly distributed across substrate 712 and may tilt substrate 712 at an angle to provide an implant angle. An ion beam 706 may be extracted from ion source 702. The acceleration stage 708 may accelerate ion beam 706 to an initial energy level by applying an extraction voltage. The mass analyzer unit 704 may analyze ion beam 706 and allow only ions having the desired charge-mass ratio to pass through. Deceleration electrode assembly 709 may modify the energy level of ion beam 706 from the initial energy level by applying a deceleration voltage. Ion beam 706 impinges onto substrate 712 and implants dopants into the non-planar semiconductor device at a desired implant energy and implant angle.

Controller 714 is coupled to the various components of the ion implanting system and controls the ion implanting system 700 to perform the methods and exemplary processes described herein. For example, controller 714 controls the extraction voltage applied by the acceleration stage 708 and the deceleration voltage applied by the deceleration electrode assembly 709 to define the implant energy of the ion beam implanting the non-planar semiconductor device on substrate 712. Controller 714 also controls the holding apparatus 710 to tilt substrate 712, thereby controlling the implant angle at which ion beam 706 implants the non-planar semiconductor device on substrate 712. Controller 714 may implement various algorithms to synchronize the implantation energy and the implantation angle to achieve the required dopant distribution in the non-planar semiconductor device.

Controller 714 may be one of any form of general purpose data processing system that can be used for controlling the various components of ion implanting system 700. Generally, controller 714 may include a processor 716 in communication with a main memory 718, a storage medium 720, and supporting devices 722 through a bus 724. Processor 716 may be one or more general-purpose processing devices such as a microprocessor, a central processing unit (CPU), or the like. Main memory 718 may be random access memory (RAM) or any other dynamic memory for transient storage of information and instructions to be executed by processor 716. Storage medium 720 may include any non-transitory computer-readable storage medium capable of storing computer software, instructions, or data, such as, but not limited to a hard disk, a floppy disk, a magnetic tape, an optical disk, read only memory (ROM) or other removable or fixed media. The supporting devices 722 may include input/output interfaces or communication interfaces such as USB ports, network interface, Ethernet, PCMCIA slot, etc.). The supporting devices 722 may allow computer programs, software, data, or other instructions to be loaded into controller 714 and provided to processor 716 for execution.

Non-transitory computer-readable storage medium, such as, main memory 718, storage medium 720, or any other suitable media internal or external to controller 714 may provide one or more sequences of one or more instructions to processor 716 for execution. Such instructions, generally referred to as "computer program code" (which may be grouped in the form of computer programs or other groupings), when executed by processor 716, may enable the controller 714 to cause the ion implanting system 700 to perform any one or more features or functions of the processes of doping a non-planar semiconductor device described herein.

As described, the implant energy of the ion beam 706 may be controlled by the adjusting the extraction voltage and/or the deceleration voltage. However, adjusting the extraction voltage to control the implant energies for a multi-energy implant process, such as the exemplary processes described herein, may not be a manufacturable solution. Adjusting the extraction voltage may require long stabilization periods to achieve a stable ion beam required for implanting. Long stabilization times result in poor productivity and throughput. Alternatively, the implant energies may be controlled by adjusting the deceleration voltage. The extraction voltage may be fixed at a value that generates an ion beam having the maximum required implant energy for a given ion implant in a multi-energy implant process (e.g., a first implant energy for a first ion implant). The deceleration voltage may then be adjusted to lower the implant energy to a different implant energy for a given ion implant in a multi-energy implant process (e.g., a second implant energy for a second ion implant). Because no stabilization period is required after adjusting the deceleration voltage, the implant energy of ion beam 706 may be controlled more efficiently with the deceleration voltage when performing a multi-energy implant process, such as the exemplary processes described herein.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method for doping a non-planar semiconductor device comprising:
    obtaining a substrate having a non-planar semiconductor body formed thereon;
    forming a padding layer over and around the non-planar semiconductor body, wherein the padding layer extends along a sidewall of the non-planar semiconductor body at least from a top surface of the non-planar semiconductor body to a top surface of the substrate;
    performing a first ion implant in a region of the non-planar semiconductor body, wherein the first ion implant has a first implant energy and a first implant angle; and
    performing a second ion implant in the region, wherein the second ion implant has a second implant energy and a second implant angle,
    wherein the first implant energy is greater than the second implant energy, and
    wherein the first implant angle is less than the second implant angle.

2. The method of claim 1, wherein the region is at least one of a channel region, a source region, a drain region, a source extension region, and a drain extension region.

3. The method of claim 1, wherein the first ion implant is performed prior to the second ion implant.

4. The method of claim 1, wherein the first ion implant is performed after the second ion implant.

5. The method of claim 1, wherein the first ion implant implants a first dopant ion species and the second ion implant implants a second dopant ion species, and wherein the first dopant ion species has a molecular mass that is different from that of the second dopant ion species.

6. The method of claim 5, wherein the first dopant ion species has a molecular mass that is greater than that of the second dopant ion species.

7. The method of claim 1, further comprising:
    performing a third ion implant in the region, wherein the third ion implant has a third implant energy and a third implant angle.

8. The method of claim 1, wherein the non-planar semiconductor body has a height, and wherein the first implant energy, the first implant angle, the second implant energy, and the second implant angle are defined to achieve a dopant concentration uniformity in the region of 3% or less across the height.

9. The method of claim 1, further comprising:
    forming an adjacent structure next to the non-planar semiconductor body, wherein the adjacent structure and the non-planar semiconductor body define a trench between the adjacent structure and the non-planar semiconductor body, and wherein the padding layer fills the trench such that a thickness of the padding layer in the trench is greater than a height of the non-planar semiconductor body.

10. The method of claim 9, wherein the non-planar semiconductor body has a top surface that is approximately planar over the non-planar semiconductor body, the adjacent structure, and the trench.

11. The method of claim 1, further comprising:
    forming a punch through stopper layer.

12. The method of claim 11, wherein the punch through stopper layer is formed in the substrate directly below the non-planar semiconductor body.

13. The method of claim 11, wherein the non-planar semiconductor body has a critical dimension and a height and wherein the punch through stopper layer is formed in the non-planar semiconductor body at a depth greater than the critical dimension and less than the height of the non-planar semiconductor body.

14. The method of claim 13, wherein the first implant energy, the first implant angle, the second implant energy, and the second implant angle are defined to achieve a dopant concentration uniformity in the region of 3% or less across the depth of the punch through stopper layer.

15. The method of claim 13, wherein the non-planar semiconductor body has a length and wherein the depth of the punch through stopper layer has a uniformity of 5% or less across the length of the non-planar semiconductor body.

16. The method of claim 1, further comprising:
annealing the non-planar semiconductor body.

17. The method of claim 1, wherein the non-planar semiconductor body is one of a fin, a nanowire, and a vertical array of nanowires.

18. The method of claim 1, wherein the non-planar semiconductor device is one of a FinFET device, a non-planar multi-gate transistor device, or a non-planar nano-wire transistor device.

19. The method of claim 1, wherein the first ion implant and the second ion implant are performed by an ion implanting system having an deceleration electrode assembly, and wherein the electrode assembly controls the first implant energy and the second implant energy.

20. The method of claim 1, wherein the first ion implant and the second ion implant are performed by an ion implanting system having a first ion beam and a second ion beam, wherein the first ion implant is performed by the first ion beam and the second ion implant is performed by the second ion beam, and wherein the first ion implant and the second ion implant are performed simultaneously.

21. A method for doping a non-planar semiconductor device comprising:
obtaining a substrate having a non-planar semiconductor body formed thereon;
forming a padding layer over and around the non-planar semiconductor body, wherein the padding layer extends along a sidewall of the non-planar semiconductor body at least from a top surface of the non-planar semiconductor body to a top surface of the substrate;
generating an ion beam from an ion source of an ion beam implanting system;
modifying, using a deceleration assembly of the ion beam implanting system, the ion beam to have a first energy;
positioning the substrate in the ion beam to implant dopant ions into a region of the non-planar semiconductor body at the first energy and a first implant angle;
modifying, using the deceleration assembly, the ion beam to have a second energy; and
positioning the substrate in the ion beam to implant dopant ions into the region at the second energy and a second implant angle, wherein:
the first energy is greater than the second energy; and
the first implant angle is less than the second implant angle.

22. A method for doping a non-planar semiconductor device comprising:
obtaining a substrate having a non-planar semiconductor body formed thereon;
forming a padding layer over and around the non-planar semiconductor body, wherein the padding layer extends along a sidewall of the non-planar semiconductor body at least from a top surface of the non-planar semiconductor body to a top surface of the substrate;
performing a first ion implant to form a punch through stopper layer in the non-planar semiconductor body;
performing a second ion implant in the region, wherein the second ion implant has a first implant energy and a first implant angle;
performing a third ion implant in the region, wherein the third ion implant has a second implant energy and a second implant angle, wherein:
the first implant energy is greater than the second implant energy; and
the first implant angle is less than the second implant angle.

23. The method of claim 21, further comprising:
forming an adjacent structure next to the non-planar semiconductor body, wherein the adjacent structure and the non-planar semiconductor body define a trench between the adjacent structure and the non-planar semiconductor body, and wherein the padding layer fills the trench such that a thickness of the padding layer in the trench is greater than a height of the non-planar semiconductor body.

24. The method of claim 23, wherein the non-planar semiconductor body has a top surface that is approximately planar over the non-planar semiconductor body, the adjacent structure, and the trench.

25. The method of claim 22, further comprising:
forming an adjacent structure next to the non-planar semiconductor body, wherein the adjacent structure and the non-planar semiconductor body define a trench between the adjacent structure and the non-planar semiconductor body, and wherein the padding layer fills the trench such that a thickness of the padding layer in the trench is greater than a height of the non-planar semiconductor body.

26. The method of claim 25, wherein the non-planar semiconductor body has a top surface that is approximately planar over the non-planar semiconductor body, the adjacent structure, and the trench.

* * * * *